(12) United States Patent
Zhu et al.

(10) Patent No.: US 7,504,328 B2
(45) Date of Patent: Mar. 17, 2009

(54) SCHOTTKY BARRIER SOURCE/DRAIN N-MOSFET USING YTTERBIUM SILICIDE

(75) Inventors: Shiyang Zhu, Singapore (SG); Jingde Chen, Singapore (SG); Sungjoo Lee, Singapore (SG); Ming Fu Li, Singapore (SG); Jagar Singh, Singapore (SG); Chunxiang Zhu, Singapore (SG); Dim-Lee Kwong, Austin, TX (US)

(73) Assignee: National University of Singapore, Singapore (SG)

( * ) Notice: Subject to any disclaimer, the term of this patent is extended or adjusted under 35 U.S.C. 154(b) by 220 days.

(21) Appl. No.: 11/126,031

(22) Filed: May 10, 2005

(65) Prior Publication Data
US 2005/0275033 A1 Dec. 15, 2005

Related U.S. Application Data

(60) Provisional application No. 60/570,126, filed on May 11, 2004.

(51) Int. Cl.
*H01L 21/441* (2006.01)

(52) U.S. Cl. .................. 438/583; 438/581; 438/92; 438/301; 257/E29.041

(58) Field of Classification Search .................. 438/580, 438/581, 583, 92, 301, 167
See application file for complete search history.

(56) References Cited

U.S. PATENT DOCUMENTS

| | | | |
|---|---|---|---|
| 5,663,584 A | 9/1997 | Welch ........................ 257/288 |
| 5,962,893 A | 10/1999 | Omura et al. ............... 257/329 |
| 6,303,479 B1 | 10/2001 | Snyder ........................ 438/581 |
| 6,495,882 B2 | 12/2002 | Snyder ........................ 257/327 |
| 6,693,294 B1 | 2/2004 | Jang et al. ...................... 257/30 |
| 2005/0059242 A1* | 3/2005 | Cabral et al. ................. 438/682 |
| 2005/0148131 A1* | 7/2005 | Brask ........................ 438/199 |
| 2005/0205947 A1* | 9/2005 | Yu et al. ..................... 257/410 |
| 2006/0038241 A1* | 2/2006 | Matsuo ........................ 257/401 |
| 2006/0084232 A1* | 4/2006 | Grupp et al. ................. 438/291 |
| 2006/0286755 A1* | 12/2006 | Brask et al. ................. 438/299 |
| 2007/0026590 A1* | 2/2007 | Snyder et al. ............... 438/167 |
| 2007/0026591 A1* | 2/2007 | Grupp et al. ................. 438/194 |

OTHER PUBLICATIONS

M.P. Lepselter and S. Sze, "SB—IGFET : An Insulated gate field-effect transistor using Schattky barrier contact as source and drain", Proc. IEEE, Sb, 1968, pp. 1400-1402.

L.E. calvet et al., "Subthreshold and scaling of PtS; Schottky barrier MOSFETs", Supperlattices and Microstructures, vol. 28, No. 5/6, 2000, pp. 501-506.

(Continued)

*Primary Examiner*—Jerome Jackson, Jr.
*Assistant Examiner*—Paul A Budd
(74) *Attorney, Agent, or Firm*—Saile Ackerman LLC; Stephen B. Ackerman

(57) ABSTRACT

A method of fabricating an N-type Schottky barrier Source/Drain Transistor (N-SSDT) with ytterbium silicide ($YbSi_{2-x}$) for source and drain is presented. The fabrication of $YbSi_{2-x}$ is compatible with the normal CMOS process but ultra-high vacuum, which is required for $ErSi_{2-x}$ fabrication, is not needed here. To prevent oxidation of ytterbium during ex situ annealing and to improve the film quality, a suitable capping layer stack has been developed.

7 Claims, 6 Drawing Sheets

OTHER PUBLICATIONS

W. Saitoh et al.,"Analysis of Short-Channel Schottky Source/Drain Metal-Oxide-Semiconductor Field-Effect Transistor on Silicon-on-Insulator Substrate and Damonstration of Sub-50-nm n-type Devices with Metal Gate", Jpn. J. Appl. Phys. vol. 38, (1999) pp. 6226-6231.

S. Zhu et al.,"Low temperature MOSFET technology with Schottky barrier source/drain, high-k gate dielectric and metalgate electrade," Solid-State Elec. 48(2004),1987-1992.

J. Larson et al.,"Schottky Barrier CMOS,"Spinnaker Semiconductor, Inc., Tech. Overview, 2003, pp 1-12.

P. Maret, et al.,"Unpinning of the Fermilevel at erbium silicide/ silicom interfaces," Physical Review B, vol. 56, No. 15, 1997, pp. 9286-9289.

J. Kedierski et al.,"Complementary silicide source/drain thin-body MOSFETS for the 20nm gate length regime,"IEDM 2000 pp. 57-60.

C.H. Luo et al.,"Growth kinetics of amorphous interlayers and formation of crystalline silicide phases in ulrahigh vacuam deposited polycrystalline Er and Tb thin films on (099) Si,"J. Appl. Phys. 82 (8), Oct. 15, 1997, pp. 3808-3814.

M. Jang et al.,"Characteristics of erbium-silicided n-type Schottky barrier tunned transistors,"App.Phys.Let., vol. 83, No. 15, Sep. 2003, pp. 2611-2613.

* cited by examiner

FIG. 1 – Prior Art

SCHOTTKY BARRIER SOURCE/DRAIN N-MOSFET USING YTTERBIUM SILICIDE

This application claims priority to U.S. Provisional Patent Application Ser. No. 60/570,126, filed on May 11, 2004, which is herein incorporated by reference in its entirety.

FIELD OF THE INVENTION

The invention relates to nanoscale MOSFET architecture, in particular to an improved high performance N-type Schottky barrier source/drain MOSFET.

BACKGROUND OF THE INVENTION

SSDTs (Schottky barrier Source/Drain Transistors), where the highly doped source/drain of the conventional MOSFET is totally replaced with a silicide, were first reported by M. P. Lepselter and S. Sze in 1968 (see ref. 1). Recently, SSDTs have received a great deal of attention due to their excellent scaling properties and ease of fabrication and have been proposed as an alternative to traditional MOSFETs for sub-100 nm integration. See ref. 2 for example However, the drain current of a SSDT is suppressed by the Schottky barrier between source and channel, resulting in small drivability and low $I_{on}/I_{off}$ ratio.

The drain current increases with decreasing barrier height. The simulation results of W. Saitoh et al (ref. 3) showed that the same drivability as a conventional MOSFET can be achieved using low Schottky barriers, i.e., for the channel length $L_c$<30 nm devices, about 0.25 eV for P-SSDT and 0.1-0.15 eV for N-SSDT, respectively. In the literature to date, PtSi is used for P-SSDT because the electron barrier height of a PtSi/Si contact is about 0.86 eV while the corresponding hole barrier is 0.24 eV which almost meets requirements. High performance P-SSDT with PtSi has also been reported by the inventors (see ref. 4).

To date, N-SSDT has usually been based on erbium silicide because it is known that $ErSi_{2-x}$ has the lowest barrier height among the known silicides. This electron barrier height is about 0.28 eV (See ref. 6). However, the film morphology of $ErSi_{2-x}$ formed by solid-state reaction of as-deposited Er and substrate Si, is quite poor due to its island-preferred growth mode (see ref. 7), resulting in larger than theoretically expected leakage currents in the device.

The reported performance of N-SSDT is not as good as that of P-SSDT (see for example, ref. 8). Moreover, the barrier height of the $ErSi_{2-x}$/Si contact is very sensitive to the residual oxygen concentration in the chamber during Er deposition and annealing. Contacts prepared in conventional vacuum displayed larger barrier heights (0.37-0.39 eV) indicating that ultra high vacuum is necessary for $ErSi_{2-x}$ fabrication, which makes the process inconvenient and costly.

Therefore, in order to improve the electrical performance of N-SSDT, it is very important to find a suitable way to reduce the barrier height and to improve the silicide quality for N-SSDT. In this invention, a solution to this problem is disclosed which leads to lower electron barrier height and better film morphology than that of $ErSi_2$ formed by an otherwise same process.

Following a routine search of the patent literature, the following references of interest were found:

M. G. Jang et al, U.S. Pat. No. 6,693,294 B1, Feb. 17, 2004, "Schottky barrier tunneling transistor using thin silicon layer on insulator and method for fabrication the same", J. P. Snyder et al, U.S. Pat. No. 6,495,882 B2, Dec. 17, 2002, "Short-channel Schottky barrier MOSFET device", J. P. Snyder et al, U.S. Pat. No. 6,303,479 B1, Oct. 16, 2001, "Method of manufacturing a short channel FET with Schottky barrier source and drain contacts", Omura, et al, U.S. Pat. No. 5,962,893, Oct. 5, 1999, "Schottky tunneling device", and J. D. Welch, U.S. Pat. No. 5,663,584, Sep. 2, 1997, "Schottky barrier MOSFET systems and fabrication thereof".

SUMMARY OF THE INVENTION

It has been an object of least one embodiment of the invention to improve the electrical performance of N-SSDT devices by means of a more suitable silicide than ErSi, the electron barrier height of an $ErSi_{2-x}$/Si contact not being low enough for N-SSDT and the quality of $ErSi_{2-x}$ being very sensitive to vacuum conditions.

Another object has been to provide a process for forming and manufacturing said improved device.

These objects have been achieved by replacing erbium silicide with ytterbium silicide. $YbSi_{2-x}$ has lower barrier height than $ErSi_{2-x}$, and its film quality is better than $ErSi_{2-x}$ formed by the same process.

The invention can be used to fabricate Schottky barrier source/drain MOSFETs, especially when the device size is scaled down to sub-50 nm. Replacing $ErSi_{2-x}$ in N-SSDTs by $YbSi_{2-x}$ improves its electrical performance significantly with no accompanying disadvantages. It should, however, be noted that the present invention does not imply that other silicides, such as ternary silicides and germano-silicide may not yield similar improvements Ytterbium silicide can be fabricated in a conventional vacuum system (base pressure about $2\times10^{-7}$ torr), the morphology of the $YbSi_{2-x}$ that is formed from the silicidation solid-state reaction being much smoother than that of $ErSi_{2-x}$. To prevent oxidation of Yb and to improve the film quality, a suitable capping layer stack of Ti/HfN, was developed as part of the invention. The annealing conditions for silicidation and selective etching procedures to remove unreacted Yb and the capping layer have also been optimized.

These $YbSi_{2-x}$ based fabrication methods for SSDTs are fully compatible with existing CMOS technologies as well as with newer industry innovations including high-k dielectrics, metal gates, SOI, and strained silicon. The self-aligned silicide S/D fabrication methods involve the deposition of a Yb/Ti/HfN stack using e-beam evaporation or sputtering, silicidation using RTA (rapid thermal anneal) and/or furnace anneal, and selective etching.

DETAILED DESCRIPTION OF THE PREFERRED EMBODIMENTS

Figure 1:
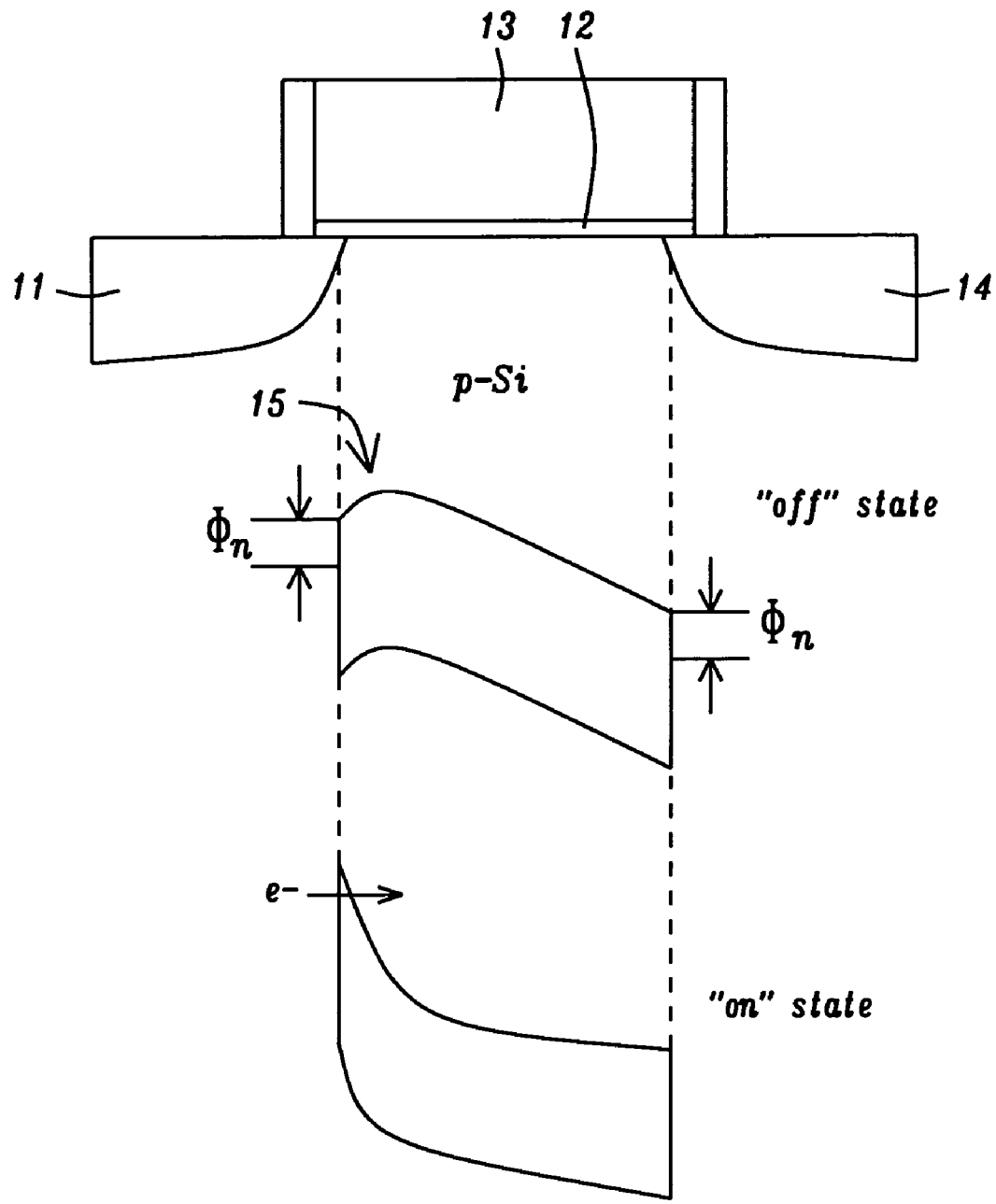
FIG. 1 illustrates the basic operation of a Schottky barrier MOSFET device.

In this invention a N-SSDT device having $YbSi_{2-x}$ source and drain is disclosed. The schematic structure and operating principles are illustrated in FIG. 1. Seen there are source 11, gate oxide 12, gate electrode 13, and drain 14. In the off state, barrier 15 slopes away from the P silicon-source interface and current flow is blocked. In the on state, the barrier is still present but has grown thin enough for current to pass through it through Fowler-Nordheim tunneling.

To avoid the introduction of unnecessary detail, a simple single mask process, which has been demonstrated in our lab, is described here. The performance of the resulting device has been compared with that of an $ErSi_{2-x}$ S/D device fabricated by the same method. It will be understood that the basic principles of the invention will continue to apply to more detailed versions of this simplified process.

It is also important to note that the self-aligned $YbSi_{2-x}$ process described here is fully compatible with existing established CMOS fabrication processes, including SOI (silicon on insulator), strained silicon, metal gates, and high K dielectrics, in general without modification.

Figure 2:
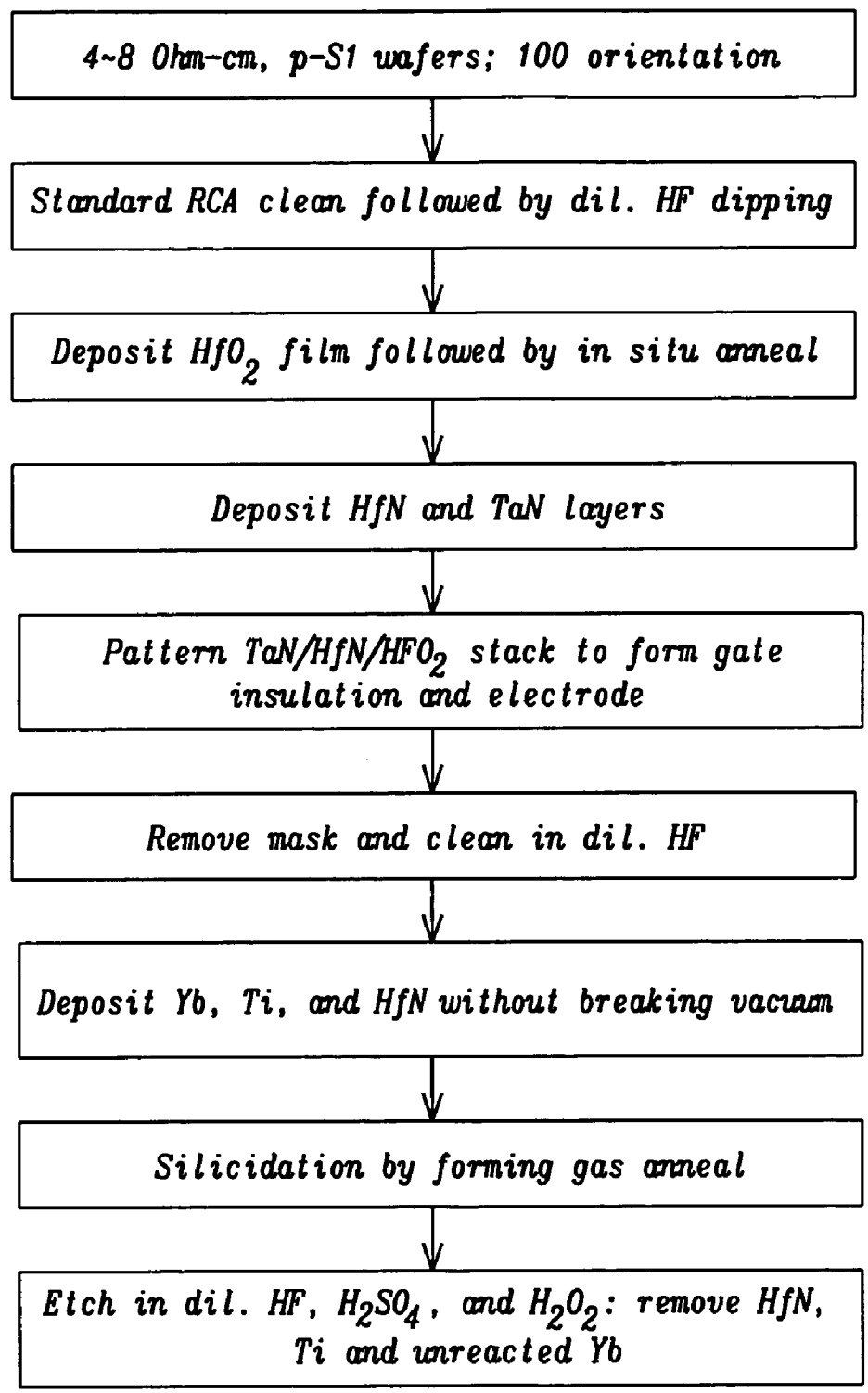
FIG. 2 is a flow chart summary of the process of the present invention.

FIG. 2 is a flow chart that summarizes the process of the invention. Yb, Ti and HfN are sequentially deposited, without breaking vacuum, using a sputtering system. HfN is used as a capping layer to prevent Yb oxidization during ex situ annealing. If vacuum annealing is used, this layer is no longer necessary. A key feature of the invention is the Ti capping layer on the Yb layer; this has been found to improve the $YbSi_{2-x}$ film quality slightly, probably because of a reduction of the oxygen concentration in the $YbSi_{2-x}$ film. The capping layers and unreacted metal are removed by wet etching in HF solution (diluted 1:100) for 3 minutes followed by $H_2SO_4$+ $H_2O_2$ solution at 120° C. for 5 minutes.

Figure 3:
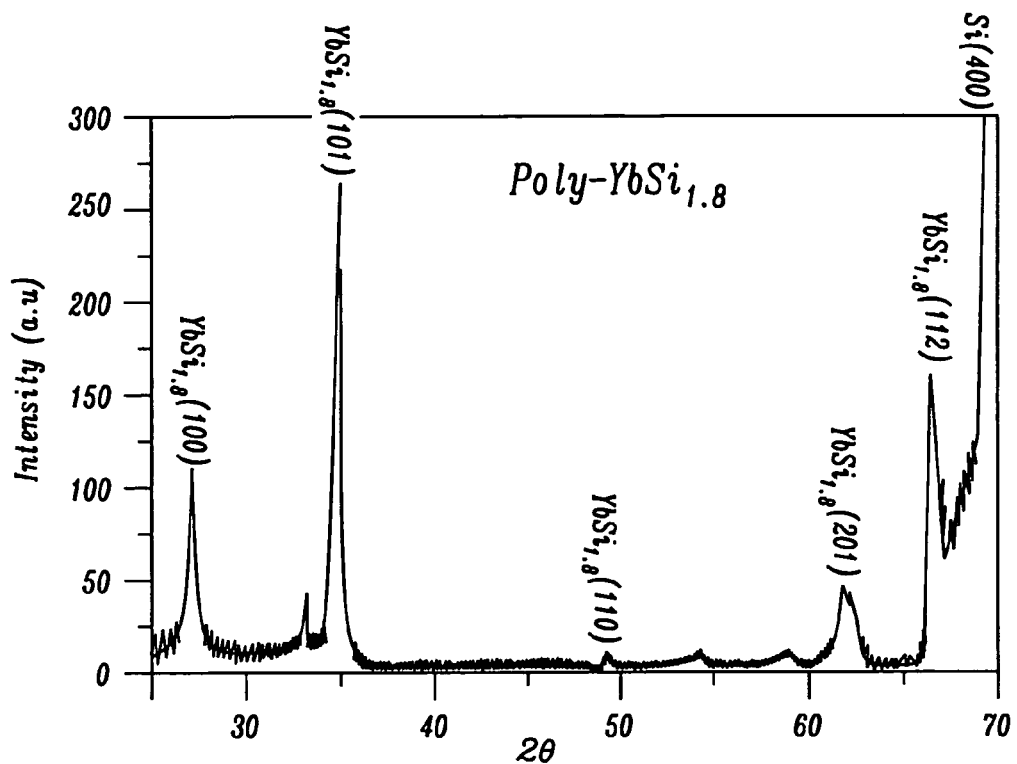
FIG. 3 is an X-ray spectrum confirming that the silicide formed is $YbSi_{1.8}$.
Figure 4A:
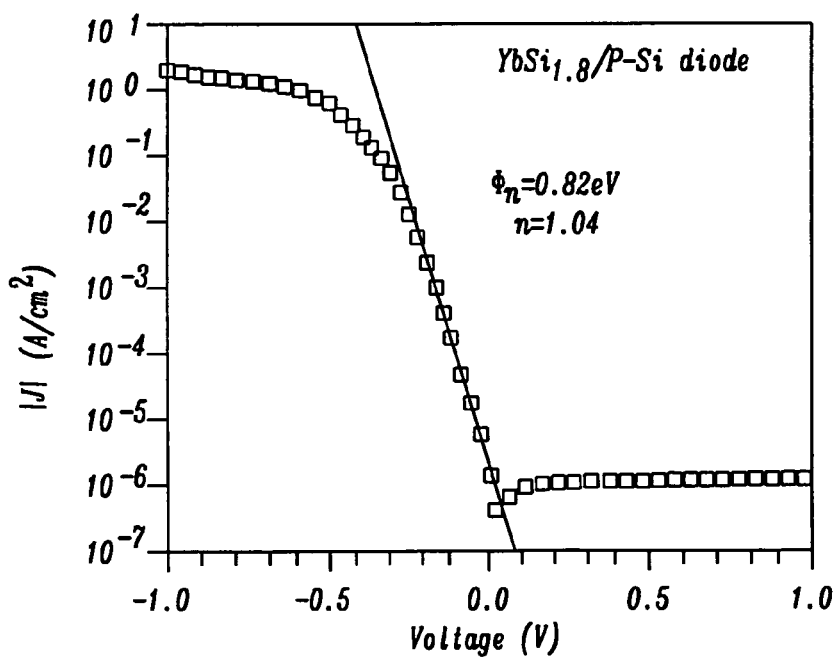
FIGS. 4a and 4b illustrate the performance of the invented device through plots of current density and capacitance as a function of voltage.
Figure 4B:
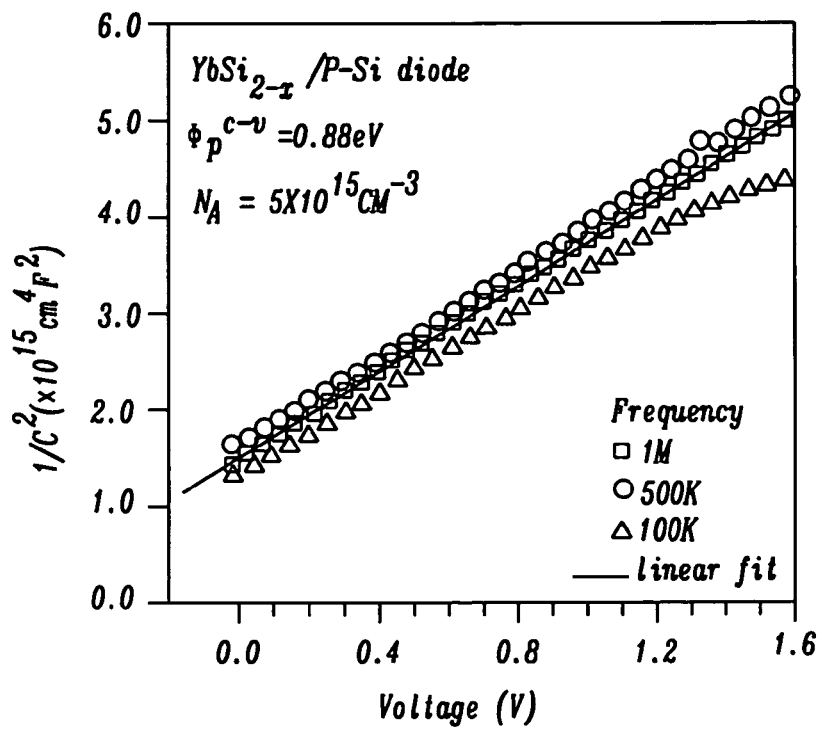

X ray diffraction results have shown that the silicide film that is formed is $YbSi_{1.8}$ as evidenced by the data shown in FIG. 3. FIGS. 4a and 4b are the I—V and C—V curves, respectively of a $YbSi_{2-x}$/p-Si diode. The hole barrier height and ideality factor deduced from the I—V curve are 0.82 eV and 1.04 respectively, the reverse bias leakage current at 1V is about $1.1 \times 10^{-6}$ A/cm$^2$, which is about 4 times smaller than for $ErSi_{2-x}$ (as reported by J. Larson et al. in ref. 5 where an MBE [molecular beam epitaxy] system was used). The barrier height and doping level of the Si substrate deduced from the C—V curve are 0.88 eV and $5 \times 10^{15}$ cm$^{-3}$, respectively, which is close to the expected value.

Figure 5A:
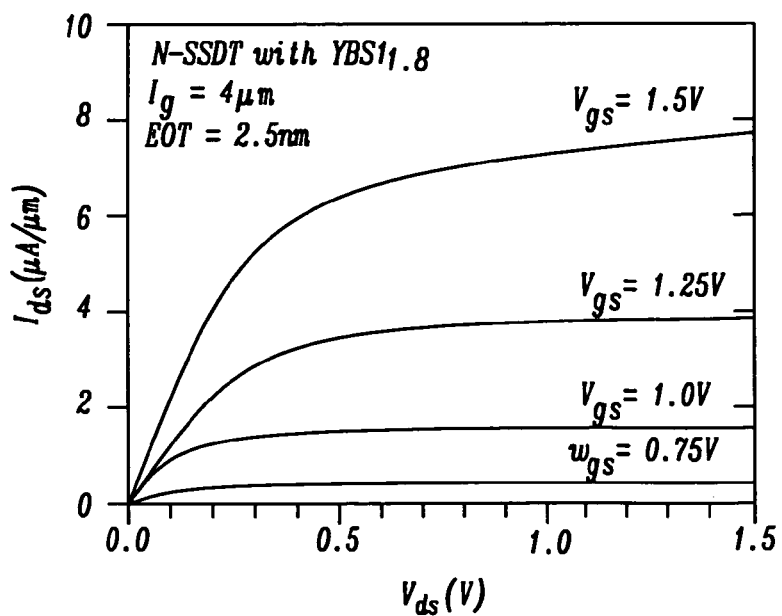
FIGS. 5a and 5b are plots of source-drain current as a function of source-drain voltage and source-gate voltage, respectively.
Figure 5B:
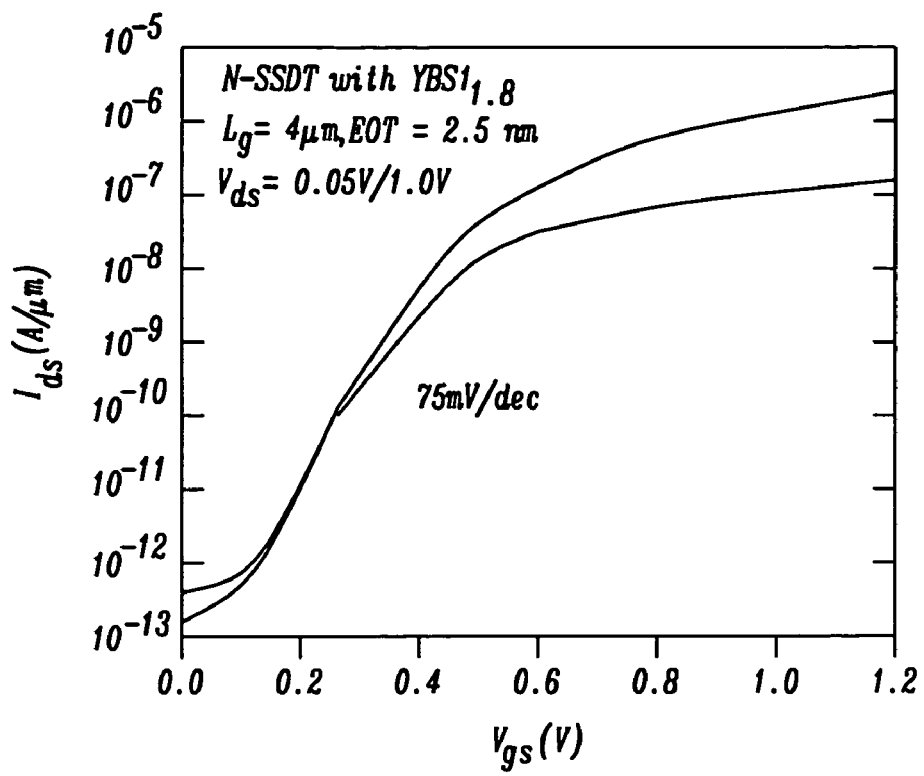

FIGS. 5a and 5b are, respectively, the $I_{ds}$-$V_{ds}$ and $I_{ds}$-$V_{gs}$ curves of a N-SSDT having a source and drain of $YbSi_{2-x}$. The EOT (effective oxide thickness) of the device is 2.5 nm. The subthreshold slope is ~75 mV/dec and the $I_{on}/I_{off}$ ratio is about $10^7$. The $I_{dsat}$ at $V_{ds}$=$V_{gs}$=1.5V is about 7.5 μA/μm for the $L_g$=4 μm device, close to that of P-SSDT with PtSi. The performance of the device is much better than the device fabricated using the same method but with $ErSi_2$ S/D, and it is better than other reported data of N-SSDT in the literature so far. Thus, these results show that $YbSi_{1.8}$ is a superior material to be integrated in N-SSDTs than the $ErSi_{1.7}$ that the prior art has employed to date.

Figure 6:
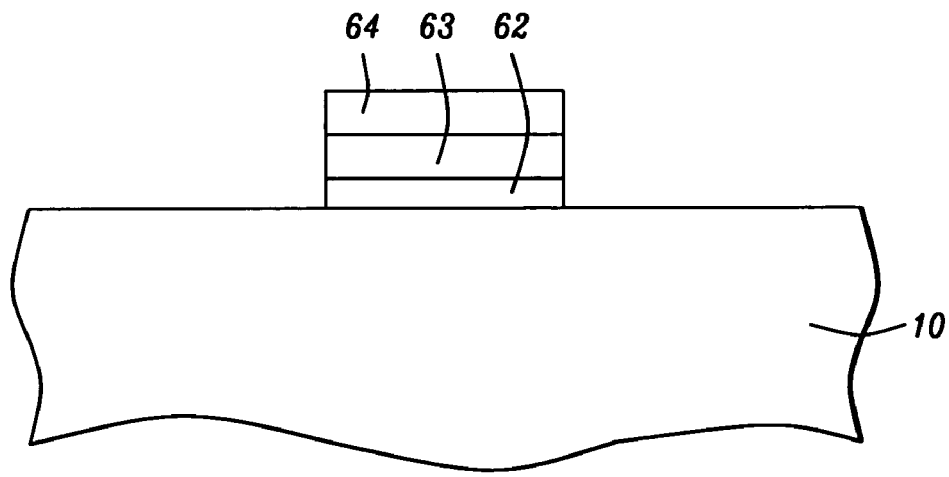
FIGS. 6-9 illustrate steps in the process of the invention.

We now begin a more detailed account of the process of the present invention by referring to FIG. 6. The process begins with the provision of a P-type silicon wafer 10 and depositing thereon layer of hafnium oxide 62 (to a thickness of between about 3 and 10 nm) which is then heated at between about 500 and 700° C. for between about 10 and 60 minutes. Next comes the deposition of layer 63 of hafnium nitride (to a thickness of between about 20 and 200 nm) on the layer of hafnium oxide following which layer 64 of tantalum nitride is deposited on this layer (to a thickness of between about 20 and 200 nm).

A suitable etch mask is then used to form the gate structure, by etching all unprotected surfaces until the silicon surface is exposed. After the etch mask has been fully removed the wafer is immersed in dilute (100:1) HF. The resulting structure is shown in FIG. 6. Sidewall spacers would normally be added to protect the gate pedestal from diffusion but are not shown here for purposes of simplification.

Figure 7:
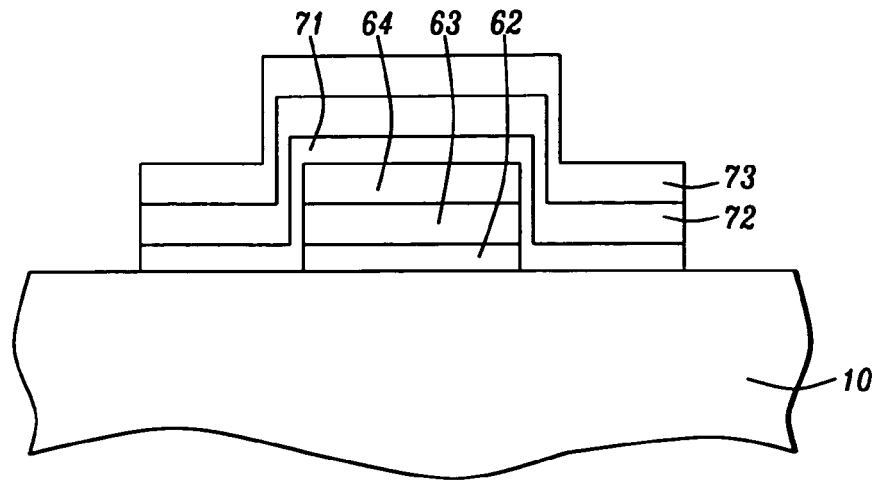

Next, in a key feature of the invention, layer 71 of ytterbium is laid down (to a thickness of between about 5 and 50 nm) followed by capping layer of titanium 72 (to a thickness of between about 1 and 10 nm) and then by second layer of hafnium nitride 73 (to a thickness of between about 50 and 200 nm), as shown in FIG. 7. The deposition of these three layers takes place during a single pump down for which the pressure is maintained at all times at a base pressure below about $5 \times 10^{-7}$ torr.

Figure 8:
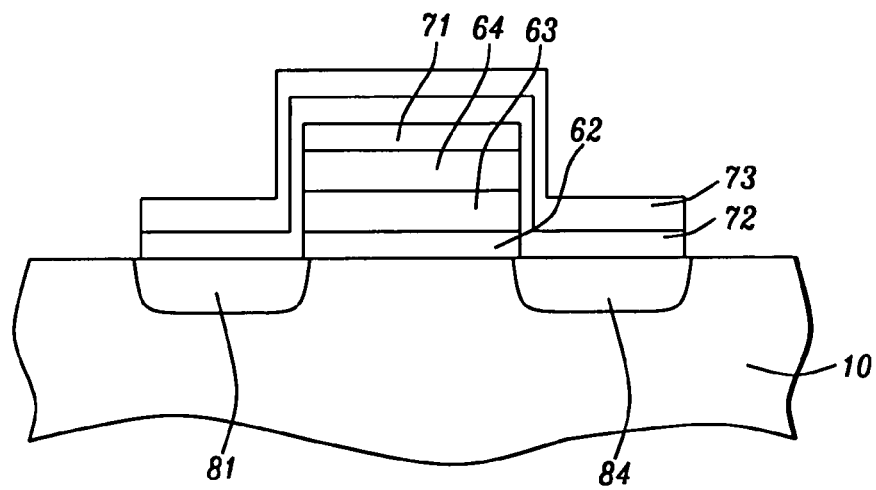

Then the structure is heated in a rapid thermal annealing system or a furnace in forming gas at a temperature between about 400 and 600° C. for about 1 hour to perform the solid-state reaction of Yb and substrate Si, resulting in the formation of ytterbium silicide source and drain regions 81 and 82 respectively (see FIG. 8).

Figure 9:
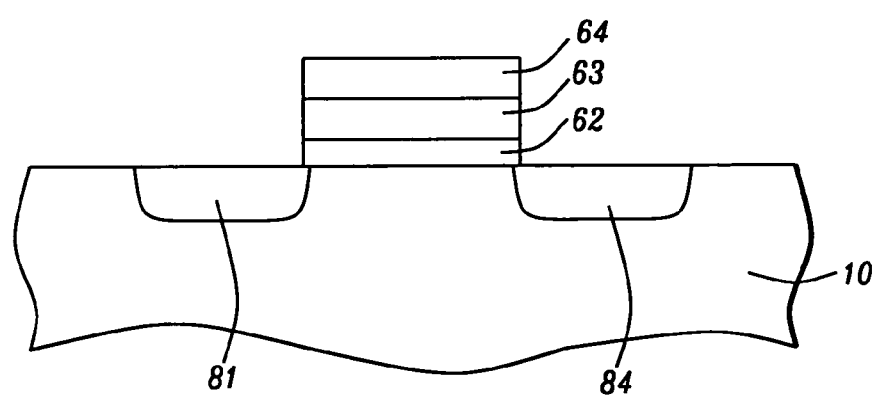

The process concludes with selective etching in dilute HF at room temperature for about 3 minutes and then in a mixture of sulphuric acid and hydrogen peroxide at about 120° C. for about 5 minutes sequentially. This results in the removal of the hafnium nitride and titanium layers as well as of any unreacted ytterbium. The ytterbium silicide in source and drain remain. The completed structure then has the appearance schematically illustrated in FIG. 9.

REFERENCES

[1] M. P. Lepselter and S. Sze, "SB-IGFET: An Insulated gate field-effect transistor using Schottky barrier contacts as source and drain", Proc. IEEE, 56, 1968

[2] L. E. Calvet, H. Luebben et al, "Subthreshold and scaling of PtSi Schottky barrier MOSFETs", Supperlattices and Microstructures, Vol. 28, No. 5/6, 2000, pp. 501-506

[3] W. Saitoh, A. Itoh, S. Yamagami and M. Asada, "Analysis of Short-Channel Schottky Source/Drain Metal-Oxide-Semiconductor Field-Effect Transistor on Silicon-on-Insulator Substrate and Demonstration of Sub-50-nm n-type Devices with Metal Gate", Jan J. Appl. Phys. 38, 1999, pp. 6226-6231

[4] Shiyang Zhu et al., "Low temperature MOSFET technology with Schottky barrier source/drain, high-k gate dielectric and metal gate electrode", presented in ISDRS 2003, submitted to Solid State Electronics

[5] J. Larson, J. Snyder, "Schottky Barrier CMOS: Technology Overview, 2003

[6] P. Muret, et al, "Unpinning of the Fermi level at erbium silicide/silicon interfaces", Physical Review B, Vol. 56, No. 15, 1997, pp. 9286-9289

[7] C. H. Luo, et al, "Growth kinetic of amorphous interlayers and formation of crystalline silicide phases in ultrahigh vacuum deposited polycrystalline Er and Tb thin film on (001)Si", J. Appl. Phys. 82(8), 1997, pp. 3808-3814

[8] J. Kedzieski, et al, "Complementary silicide source/drain thin-body MOSFETs for the 20 nm gate length regime", IEDM, 2000, pp. 57-60

[9] M. Jang et al, "Characteristics of erbium-silicided n-type Schottky barrier tunnel transistors", Appl. Phys. Lett., 83(13), 2003, pp. 2611-2613

What is claimed is:

1. A process to manufacture a MOSFET, having a source, a gate, and a drain, comprising:
   providing a P-type silicon wafer and depositing thereon a layer of hafnium oxide;

heating said oxide coated wafer at between about 500 and 600° C. for between about 10 and 60 minutes;

depositing a first layer of hafnium nitride on said layer of hafnium oxide;

then depositing a layer of tantalum nitride on said first layer of hafnium nitride;

forming an etch mask that defines said gate and then forming said gate by etching all unprotected surfaces until said silicon wafer is exposed;

fully removing said etch mask and then immersing said wafer in dilute HF;

then, in a chamber maintained at all times at a pressure below about $5\times10^{-7}$ torr, depositing, in succession, a silicide forming layer of ytterbium followed by a capping layer of titanium and then a second layer of hafnium nitride;

then heating said wafer in forming gas at a temperature between about 400 and 600° C. for about 1 hour, thereby forming opposing source and drain regions of ytterbium silicide immediately adjacent to said gate; and through etching in dilute HF and then in a mixture of sulphuric acid and hydrogen peroxide, removing said layers of titanium and hafnium nitride as well as any unreacted ytterbium.

2. The process recited in claim 1 wherein said layer of hafnium oxide is deposited to a thickness of between about 3 and 10 nm.

3. The process recited in claim 1 wherein said layer of ytterbium is deposited to a thickness of between about 5 and 50 nm.

4. The process recited in claim 1 wherein said layer of titanium is deposited to a thickness of between about 1 and 10 nm.

5. The process recited in claim 1 wherein said second layer of hafnium nitride is deposited to a thickness of between about 50 and 200 nm.

6. The process recited in claim 1 wherein said dilute HF solution comprises pure HF diluted 100:1 in water.

7. The process recited in claim 1 wherein the step of etching in a $H_2SO_4+H_2O_2$ solution is performed at about at 120° C. for about 5 minutes.

* * * * *